US012663461B2

(12) United States Patent
Wang et al.

(10) Patent No.: US 12,663,461 B2
(45) Date of Patent: Jun. 23, 2026

(54) SYSTEM FOR THERMAL TESTING A WAFER CHUCK AND METHODS FOR PERFORMING THE SAME

(71) Applicant: Taiwan Semiconductor Manufacturing Company Limited, Hsinchu (TW)

(72) Inventors: Chia Wei Wang, Taipei City (TW); Jian Cheng Chen, Hsinchu (TW); Huang Tang Peng, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 159 days.

(21) Appl. No.: 18/443,352

(22) Filed: Feb. 16, 2024

(65) Prior Publication Data

US 2025/0264522 A1     Aug. 21, 2025

(51) Int. Cl.
*G01R 31/28* (2006.01)
*G01K 13/00* (2021.01)

(52) U.S. Cl.
CPC ......... *G01R 31/2875* (2013.01); *G01K 13/00* (2013.01)

(58) Field of Classification Search
CPC ............ G01R 31/2874; G01R 31/2865; G01R 31/2875; G01R 31/2891; G01R 31/2877; G01R 1/07307; G01R 31/2862; G01R 1/04; G01R 31/003; G01R 31/2817;

G01R 1/06794; G01R 35/005; G01R 31/2881; G01R 19/32; G01R 31/2619; H05B 1/00; H05B 6/06; H05B 3/06; H05B 3/0019; H05B 1/02; H05B 3/28; G01K 7/00; G01K 1/026; G01K 15/002; G01K 2213/00; G01K 17/00; G01K 1/143
See application file for complete search history.

(56) References Cited

U.S. PATENT DOCUMENTS

| | | | | |
|---|---|---|---|---|
| 6,111,421 A * | 8/2000 | Takahashi | .......... | G01R 31/2887 |
| | | | | 324/750.04 |
| 7,492,176 B2 * | 2/2009 | Chiba | ................ | G01R 31/2865 |
| | | | | 324/750.28 |
| 7,812,627 B2 * | 10/2010 | Yamamoto | ......... | G01R 31/2875 |
| | | | | 324/750.05 |
| 9,519,009 B2 * | 12/2016 | Murakami | ......... | G01R 31/2601 |
| 11,639,957 B2 * | 5/2023 | McCusker | ......... | G01R 31/2862 |
| | | | | 324/750.13 |
| 11,719,744 B2 * | 8/2023 | Nakayama | ......... | G01R 31/2831 |
| | | | | 324/750.03 |
| 11,768,236 B2 * | 9/2023 | Agawa | ............... | G01R 31/2874 |
| | | | | 324/754.1 |
| 12,276,692 B2 * | 4/2025 | Reitinger | ........... | G01R 31/2865 |

* cited by examiner

*Primary Examiner* — Vinh P Nguyen
(74) *Attorney, Agent, or Firm* — The Marbury Law Group, PLLC

(57) ABSTRACT

A system for testing a wafer chuck includes: a thermal test vehicle (TTV) that includes a substrate and thermal probes disposed on the substrate; and a vehicle controller configured to control heating of the substrate by the thermal probes and to store temperature data generated by the thermal probes.

20 Claims, 6 Drawing Sheets

Dispose TTV on chuck

402

Heat substrate using TTV

404

Record temperature data

406

Determine chuck thermal properties

408

Determine chuck application suitability

410

SYSTEM FOR THERMAL TESTING A WAFER CHUCK AND METHODS FOR PERFORMING THE SAME

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

In addition to smaller electronic components, improvements to the packaging of components seek to provide smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), package on package (POP), System on Chip (SoC) or System on Integrated Circuit (SoIC) devices. Some of these 3D devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to the testing of high performance semiconductor devices, such as three-dimensional devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
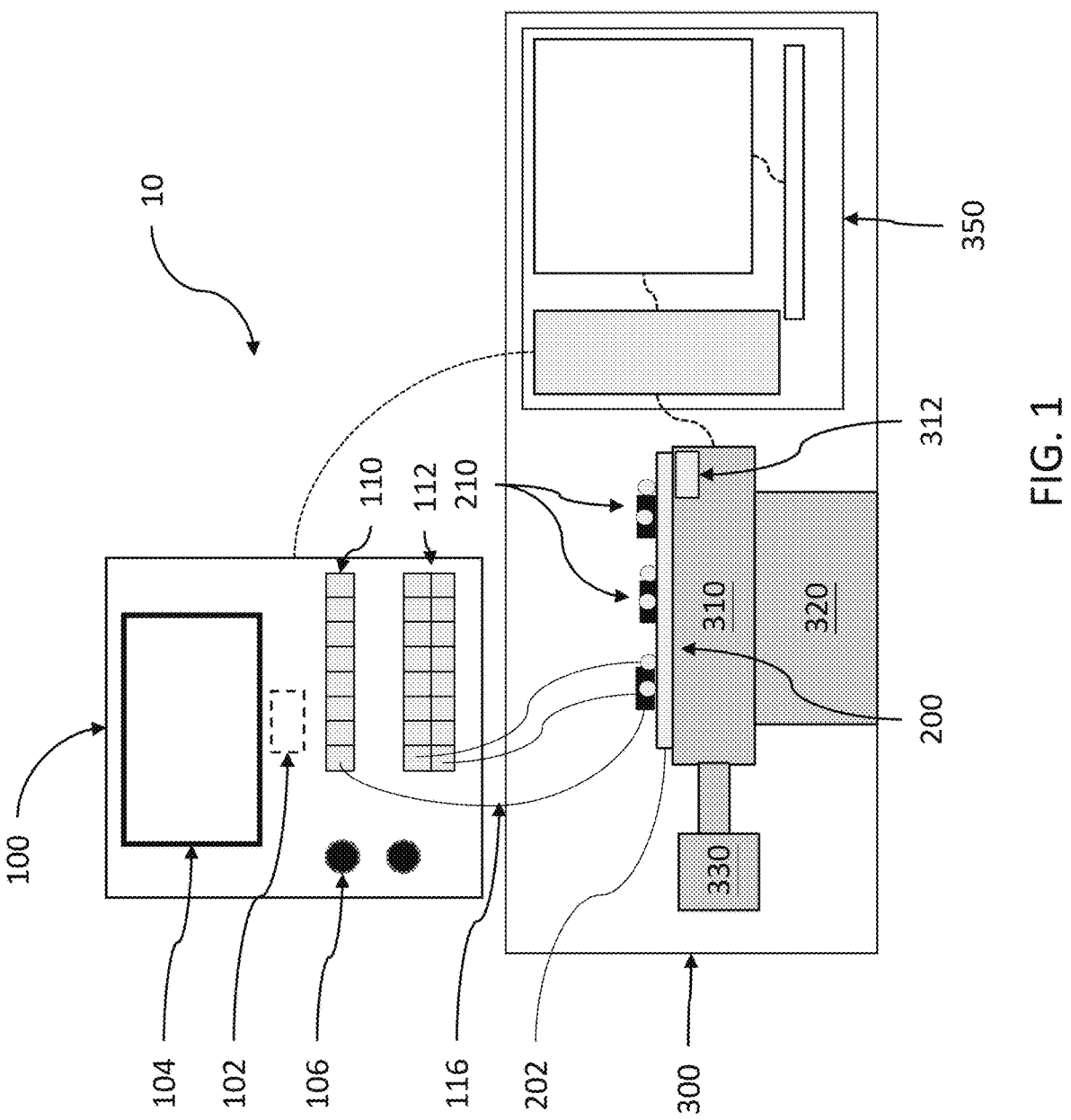
FIG. 1 is a schematic view of a chuck testing system including a thermal test vehicle (TTV), according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The 3D packaging of integrated circuit chips on a semiconductor wafer involves the vertical stacking of semiconductor devices on a wafer substrate and is considered a key packaging technique in the post-Moore's law era. For example, logic and memory chips or device layers may be vertically stacked to form a 3D structure. 3D packaging increases the density of semiconductor device layers of a chip, which reduces not only the footprint of the semiconductor device but also beneficially reduces a current flow path between device layers, as compared to other 2D packaging methods that include semiconductor devices arranged in a horizontal plane.

In order to provide further compact packaging, wafer substrates may be thinned by various grinding processes, such as back grinding. In general, such methods include supporting a wafer between a rotating chuck and a counter rotating grinding wheel, while cooling the wafer with deionized water. The reduced size and weight of thinned wafers provides for the production of smaller and more compact circuits, such as integrated circuit packages for use in compact electronic devices.

However, thinned wafers may be more susceptible to unwanted changes in wafer topography. In particular, wafer topography is the thickness distribution of a wafer, which may greatly impact wafer quality. The topography of a semiconductor wafer may directly impact the number of device layers that may be formed thereon and/or may even cause difficulties during subsequent processing and/or testing. For example, thinner semiconductor wafers may be more susceptible to warpage due to thermal variations and/or warpage due to surface variations in an underlying support device such as a wafer chuck.

A wafer prober is a machine used to verify the functionality of integrated circuits formed on a wafer. A wafer prober may be used to electrically test integrated circuits formed on a wafer. The wafer prober may include a probe card including a set of microscopic contacts or probes. During testing, the probes may be moved into electrical contact with a wafer under test. The wafer under test may be vacuum mounted on a wafer chuck. The electrical testing of high performance devices may require a high voltage and/or a high current, which may generate high temperatures in tested devices. High temperatures may reduce product yields and/or damage probe cards. For example, high temperatures may damage contact pads, probe tips, and/or transistors.

Wafer chucks may be designed to dissipate heat generated during wafer testing. However, the heat dissipation performance of different wafer chucks may vary by a wide margin. For example, wafer chucks may be designed to operate at extremely high or extremely low temperatures. Wafer chucks may have widely varying temperature ramping speeds. In addition, the heat dissipation performance of wafer chucks may vary from chuck-to-chuck, even among in wafer chucks produced in the same batch or manufacturing process. The heat dissipation performance of a wafer chuck may also vary in different regions of the same wafer chuck. Moreover, different wafer chucks may have very different heat dissipation capabilities.

The surface flatness of a wafer chuck may also affect heat dissipation performance. For example, surface flatness irregularities may result in contact area variations, which may in turn produce higher and/or lower amounts of wafer-to-chuck heat transfer in different regions of a wafer. As such, maximizing the surface flatness of a wafer chuck may produce ideal contact area for a wafer. Surface flatness and/or heat dissipation uniformity may be especially important when testing thinned semiconductor devices since such devices are more susceptible to thermal and surface flatness variations. For example, small surface and/or temperature variations may result in the disconnection of a wafer from a test prober due to wafer warping. In addition, temperature variations resulting from inadequate cooling may result in excess heat accumulation, which may damage a semiconductor wafer being tested.

Currently, there is no standardized method of measuring chuck characteristics, such as surface flatness and/or heat dissipation performance. As such, it may be difficult to identify wafer chucks that are suitable for particular applications and to ensure wafer chuck quality control. For example, other methods of wafer chuck testing may involve placing a product semiconductor wafer on a chuck, positioning a prober card over the wafer and in electrical contact with contact pads or elements of the wafer, and then utilizing a special test program to apply current to the product semiconductor wafer, in order to heat the product semiconductor wafer and stress the wafer chuck. However, the results of such testing is highly case specific. In addition, such testing often results in prober card damage. Therefore, there is a desire to provide improved wafer chuck performance and quality control testing.

Figure 2A:
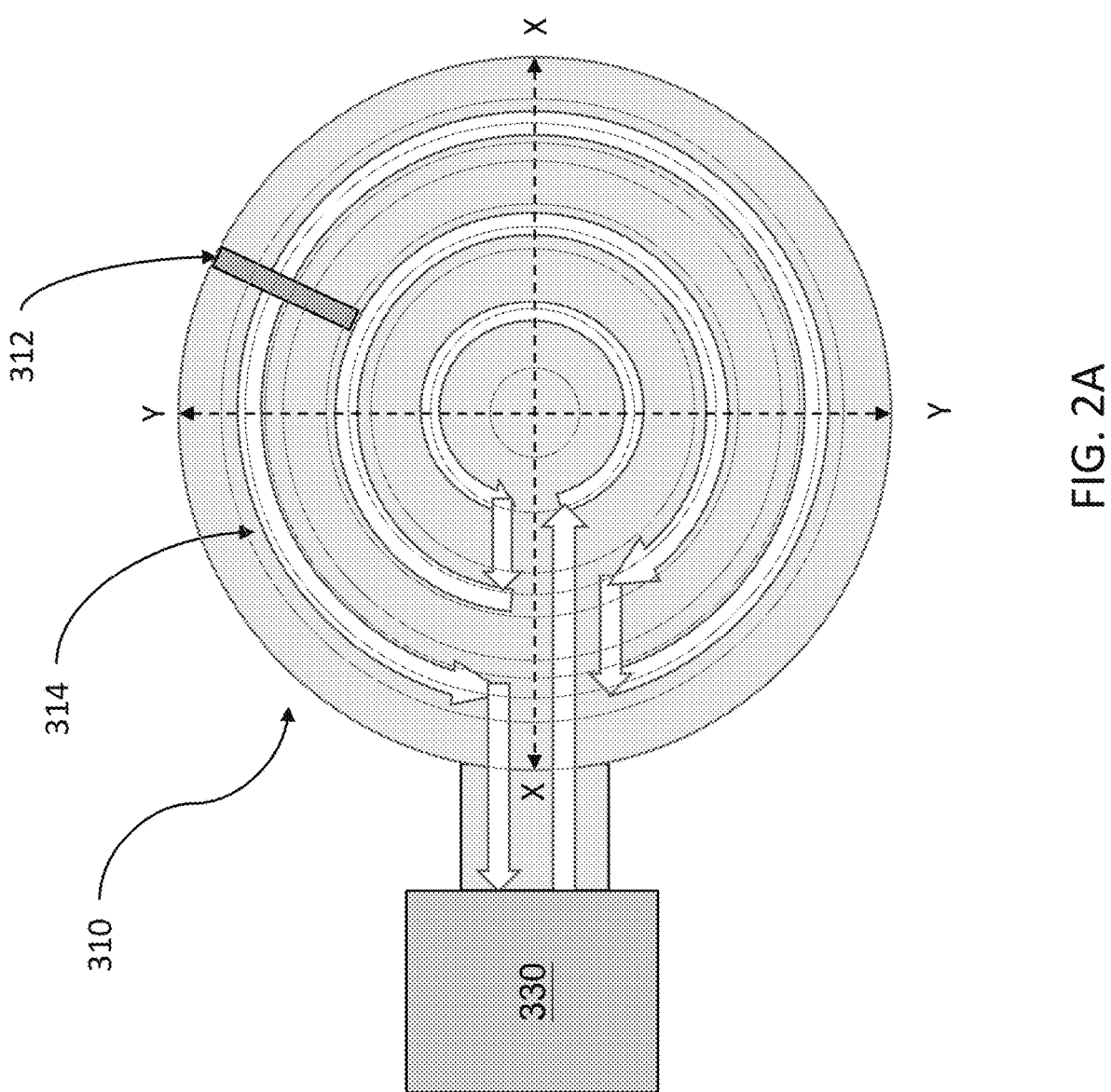
FIG. 2A is a partially transparent view of a chuck of FIG. 1.

FIG. 1 is a schematic view of a wafer chuck testing system 10, according to various embodiments of the present disclosure. FIG. 2A is a partially transparent view of a wafer chuck 310 of FIG. 1, FIG. 2B is a plan view of a thermal test vehicle (TTV) 200 of FIG. 1 disposed on the wafer chuck 310, and FIG. 2C is an enlarged view of a thermal probe 210 of the TTV 200 of FIG. 2B.

Figures 2B, 2C:
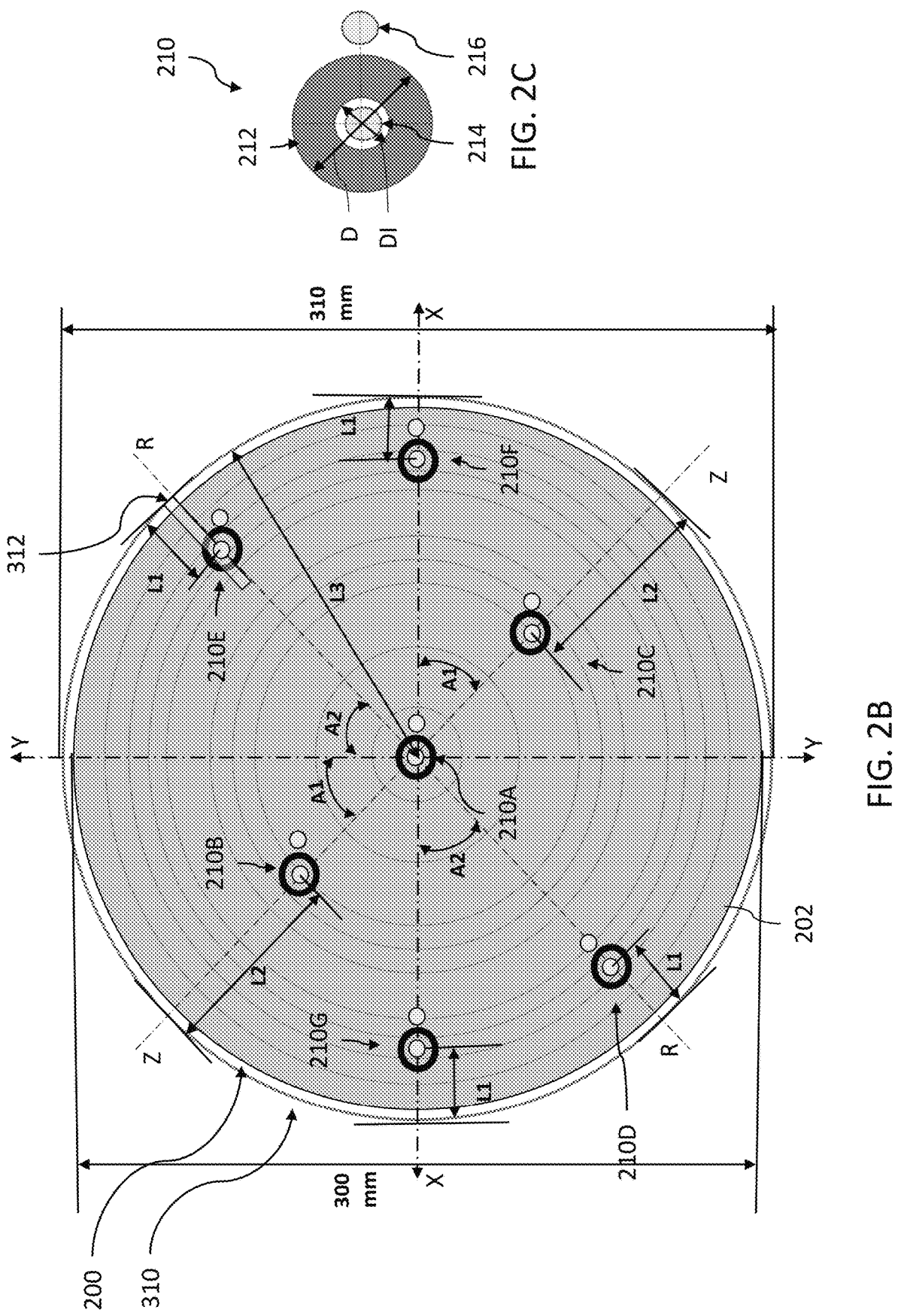
FIG. 2B is a plan view of a TTV of FIG. 1 disposed on the chuck.
FIG. 2C is an enlarged view of a thermal probe of the TTV of FIG. 2B.

Referring to FIGS. 1-2C, the system 10 may include a vehicle controller 100 and a thermal test vehicle (TTV) 200. In various embodiments, the system 10 may be used in conjunction with a wafer prober 300 that may include a wafer chuck 310, a wafer chuck support 320, a cooler 330, and a prober controller 350.

The vehicle controller 100 may include a processor 102, a display 104, one or more switches 106, power contacts 110, and/or sensor contacts 112. The processor 102 may be a central processing unit including a control unit, a logic unit (e.g., a programmable logic circuit), and/or a memory. The processor 102 may be electrically connected to the display 104, the switch 106, the power contacts 110, and the sensor contacts 112. The processor 102 may be configured to execute testing protocols stored in the memory. For example, the processor 102 may be configured to control power output to the power contacts 110 based on a testing protocol that may be selected using the switch 106. The processor 102 may also be configured to process and/or store data from the sensor contacts 112, such as temperature data.

In some embodiments, the prober controller 350 may be a computer configured to control the wafer prober 300. The vehicle controller 100 may be electrically connected to the prober controller 350. For example, data collected by the vehicle controller 100 from the TTV 200 may be stored and/or analyzed in the prober controller 350.

The wafer chuck 310 may have a flat upper surface configured to support a wafer during wafer testing. The wafer chuck 310 may include at least one position sensor 312 to determine the position of a wafer on the upper surface of the wafer chuck 310. The wafer chuck 310 may be configured to absorb heat from a wafer during testing. For example, the wafer chuck 310 may be formed of a thermally conductive material, such as a metal or ceramic material. The wafer chuck 310 may also include an internal coolant line 314 configured to receive a cooling fluid such as water, nitrogen, or clean dry air. In some embodiments, the coolant line 314 may be arranged in generally concentric rings as shown in FIG. 2A. However, the wafer chuck 310 may have any suitable coolant line 314 configuration, such as a serpentine configuration, a parallel configuration, or the like. In some embodiments, the wafer chuck 310 may have two or more coolant lines 314.

The cooler 330 may be configured to circulate the cooling fluid through the coolant line 314 to cool the wafer chuck 310. In some embodiments, the cooler 330 may include a heat exchanger or the like to cool the cooling fluid. For example, the cooler 330 may be configured to cool relatively high temperature cooling fluid received from the wafer chuck 310 and provide relatively low temperature cooled cooling fluid to the wafer chuck 310.

The temperature of the cooling fluid may increase as it flows through the wafer chuck 310, due to absorbing heat from the wafer chuck 310. As such, the heat dissipation properties of the wafer chuck 310 may vary throughout all portions of the wafer chuck 310. For example, the center of the wafer chuck 310 may be capable of absorbing more heat than other regions of the wafer chuck 310, due to the configuration of the coolant line 314. Manufacturing defects in the wafer chuck 310 and/or coolant line 314 may also result in wafer chuck 310 temperature variations. For example, surface flatness variations, material density variations, and/or coolant line diameter variations may produce temperature variations in the wafer chuck 310 during heating and/or cooling processes.

Accordingly, the TTV 200 may be configured to detect temperature variations in the wafer chuck 310. For example, the TTV 200 may be configured to detect temperature variations of as little as 0.25° C. or less. As shown in FIGS. 2B and 2C, the TTV 200 may include a substrate 202 having a bottom surface and an opposing top surface, and one or more thermal probes 210 disposed on the top surface of the substrate 202. The bottom surface of the substrate 202 may be planar and may be configured to directly contact the planar top surface of the wafer chuck 310.

In various embodiments, the TTV 200 may include any suitable number of thermal probes 210. For example, the TTV 200 may include seven (7) thermal probes 210A-210G as shown in FIG. 2B. However, a greater or lesser number of thermal probes 210 may be used. For example, the TTV 200 may include from 4 to 14 thermal probes 210, such as from 5 to 12 thermal probes 210, or from 6 to 10 thermal probes 210. The substrate 202 may be a wafer formed of a semiconductor material, such a silicon, gallium arsenide, gallium nitride, silicon carbide, or the like. However, the substrate 202 may be formed of any suitable thermally conductive material, such as a metal or ceramic material.

The thermal probes 210 may include a heater 212, an inner temperature sensor 214, and an outer temperature sensor 216. The thermal probes 210 may be disposed directly on the upper surface of the substrate 202 and may be electrically connected to the vehicle controller 100 using wires 116. For example, the heaters 212 may be connected to corresponding power contacts 110, and the temperature sensors 214, 216 may be connected to corresponding sensor contacts 112.

The heaters 212 may include annular resistive or inductive heating elements, for example, and may be disposed in direct thermal contact with the substrate 202. In some embodiments, the heaters 212 may have a diameter D ranging from 15 mm to 25 mm, such as from 18 mm to 22 mm, or about 20 mm, and an inner diameter DI ranging from 3 mm to 13 mm, such as from 6 mm to 10 mm, or about 8 mm. However, the present disclosure is not limited to any particular heater 212 dimensions.

The temperature sensors 214, 216 may be any suitable type of temperature sensor, such as a thermocouple, a silicon-based sensor, a thermistor, combinations thereof, or the like. In some embodiments, the temperature sensors 214, 216 may be replaced by, or used in conjunction with, one or more optical temperature sensors disposed above the substrate 202. The inner temperature sensor 214 may be disposed directly on the substrate 202, inside of the corresponding heater 212. The outer temperature sensor 216 may be disposed directly on the substrate 202, outside of the corresponding heater 212. In various embodiments, the inner and outer temperature sensors 214, 216 may be disposed approximately the same distance from a corresponding heater 212. For example, the inner temperature sensor 214 and outer temperature sensor 216 may be disposed within 5 mm of the corresponding heater 212. The inner temperature sensor 214 and outer temperature sensor 216 of each thermal probe 210 may be aligned in any direction. For example, inner temperature sensor 214 and outer temperature sensor 216 of one or more of the thermal probes 210 may be aligned parallel to an X axis or to a perpendicular Y axis of the substrate 202. In other embodiments, the inner temperature sensor 214 and outer temperature sensor 216 of one or more of the thermal probes 210 may be aligned with a corresponding radial axis of the substrate 202.

According to various embodiments, one or more of the thermal probes 210 may be configured to completely or at least partially vertically overlap with the coolant line 314. For example, in some embodiments, the radial center of the inner temperature sensor 214 and the radial center of the heater 212 may directly overlap with the coolant line 314. In some embodiments, one of the inner temperature sensor 214 and the outer temperature sensor 216 may completely or partially vertically overlap with the coolant line 314, and the heater 212 may partially vertically overlap with the coolant line 314.

In some embodiments, the diameter of the substrate 202 may be approximately the same as the diameter of the wafer chuck 310 to be tested. For example, the diameter of the substrate 202 may be within about +/−5% of the diameter of the wafer chuck 310. For example, the exemplified wafer chuck 310 may have a diameter of 310 mm and the substrate 202 may have a diameter of 300 mm. In the alternative, the wafer chuck 310 may have a diameter of 300 mm and the substrate 202 may have a diameter of 302 mm.

The thermal probes 210 may be arranged in various locations on the substrate 202. Herein, the location of a thermal probe 210 may be measured with respect to the radial center of the heater 212, taken in a direction parallel to the surface of the wafer chuck 310. For example, the TTV 200 may include a first probe 210A located at the radial center of the substrate 202. In some embodiments, the center of the first probe 210A may be disposed at a radial distance L3 from the edge of the wafer chuck 310 that ranges from 140 mm to 170 mm, such as from 150 mm to 160 mm, or 155 mm.

The TTV 200 may include a second probe 210B and a third probe 210C that may be disposed a radial distance L2 from the edge of the wafer chuck 310 that ranges from 65 mm to 110 mm, such as from 75 mm to 100 mm, or 85 mm. The second probe 210B and third probe 210C may be disposed on a radial axis Z that is disposed at an angle A1 with respect to an X axis and/or Y axis of the wafer chuck 310. Angle A1 may range from 0 to 90°, such as from 20° to 70°, from 30° to 60°, from 40° to 50°, or 45°.

The TTV 200 may include a fourth probe 210D, a fifth probe 210E, a sixth probe 210F, and a seventh probe 210G that may be disposed a radial distance L1 from the edge of the wafer chuck 310 that ranges from 35 mm to 60 mm, such as from 40 mm to 55 mm, or 45 mm to 50 mm. The fourth probe 210D and the fifth probe 210E may be disposed on a radial axis R that is disposed at an angle A2 with respect to an X and/or Y axis of the wafer chuck 310. Angle A2 may range from 0 to 90°, such as from 20° to 70°, from 30° to 60°, from 40° to 50°, or 45°. In some embodiments, the R axis may be perpendicular to the Z axis.

Figure 3:
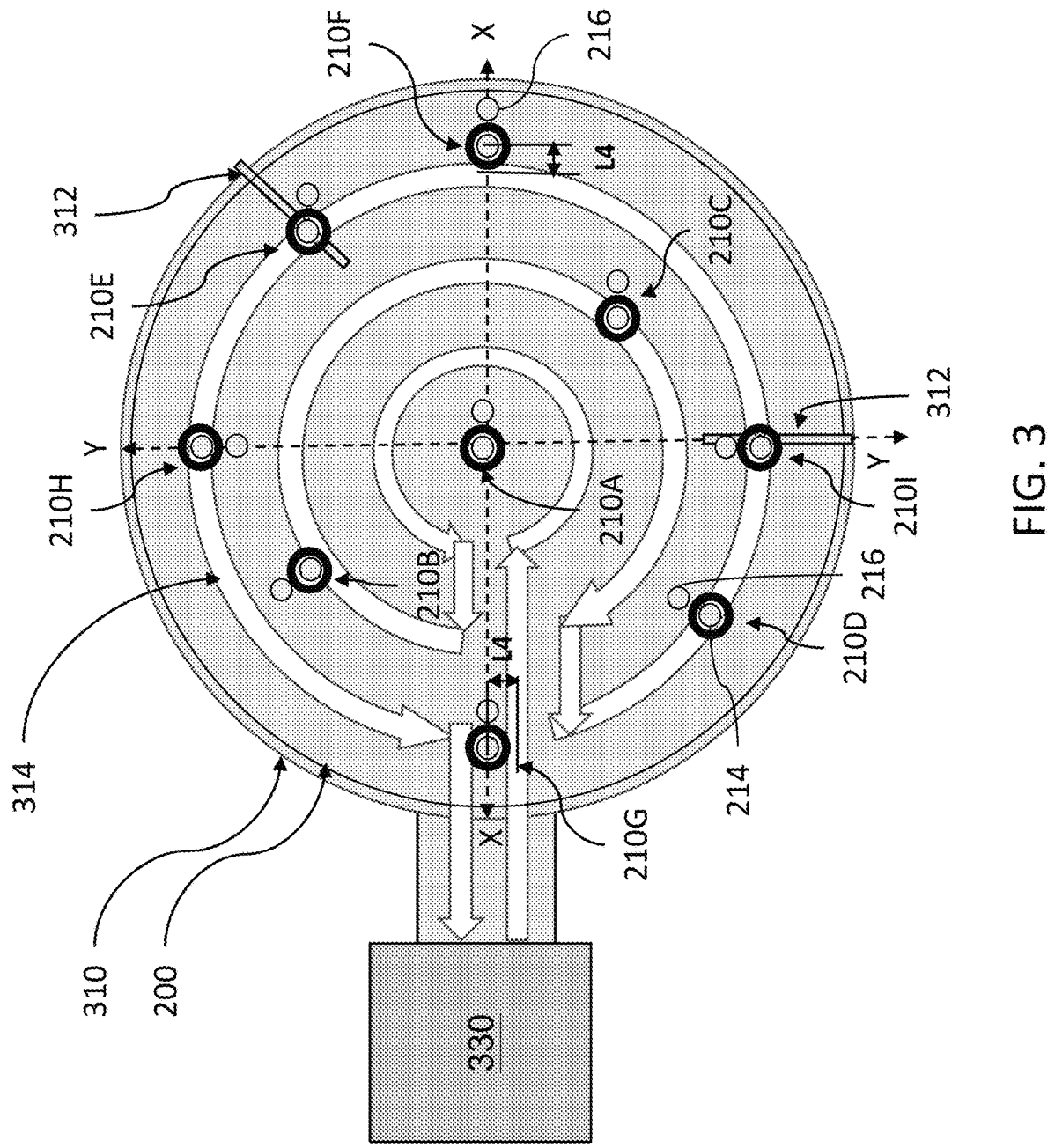
FIG. 3 is a partially transparent plan view of a TTV disposed on a wafer chuck, according to various embodiments of the present disclosure.

FIG. 3 is a partially transparent plan view of a TTV 200 disposed on a wafer chuck 310, according to various embodiments of the present disclosure. Referring to FIG. 3, the thermal probes 210 may be disposed within a distance L4 of the middle of a corresponding portion of the coolant line 314 of the wafer chuck 310. For example, distance L4 may range from 0 mm to 30 mm, such as from 0 mm to 20 mm, or from 0 mm to 10 mm. In some embodiments, the thermal probes 210 may at least partially vertically overlap with the coolant line 314.

In various embodiments, the inner temperature sensor 214 and outer temperature sensor 216 of each thermal probe 210 may be arranged in any direction. In some embodiments, at least one of the thermal probes 210, such as the fifth probe 210E, may be disposed adjacent to a position sensor 312 of the wafer chuck 310 and may be utilized to determine the position of the TTV 200 relative to the wafer chuck 310. In some embodiments, at least one of the thermal probes 210, such as the seventh probe 210G, may be disposed adjacent to inlet and/or outlet portions of the coolant line 314.

In some embodiments, the TTV 200 may include an eighth probe 210H and a ninth probe 210I. The eighth probe 210H and ninth probe 210I may be disposed along a Y axis of the TTV.

Figure 4:
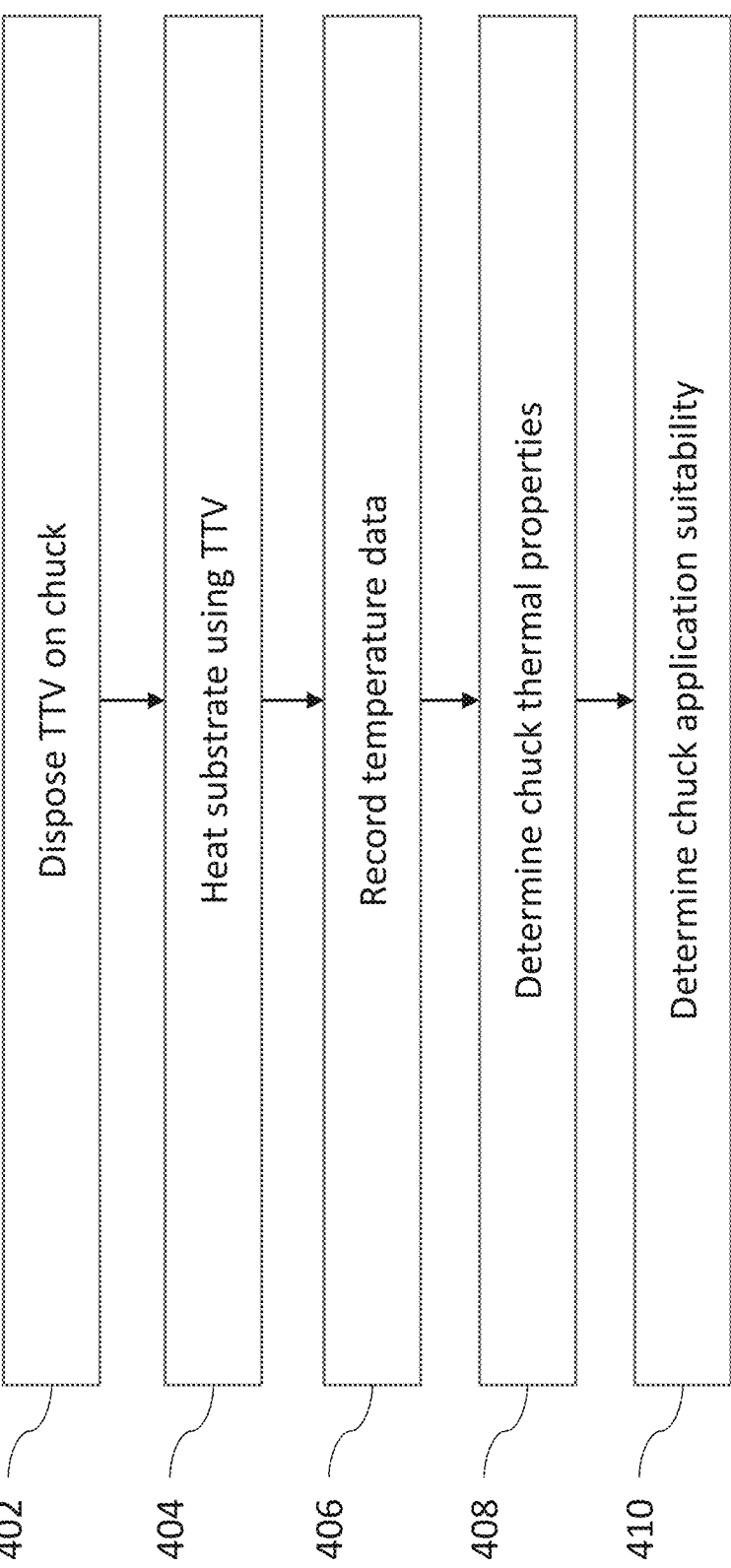
FIG. 4 is a flow diagram illustrating a chuck testing method according to various embodiments of the present disclosure.
Figure 5:
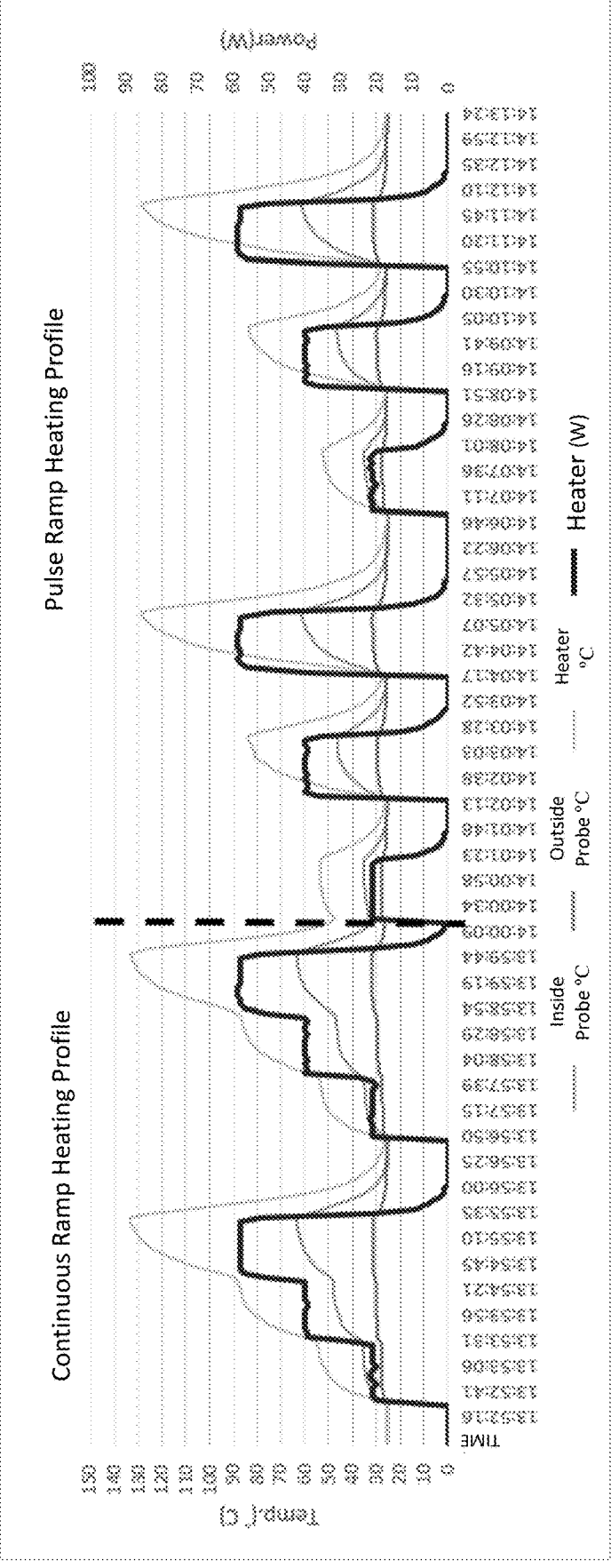
FIG. 5 is a graph showing probe power and temperature measurements taken during continuous ramp heating and pulse ramp heating tests, according to various embodiments of the present disclosure.

FIG. 4 is a flow diagram illustrating a chuck testing method according to various embodiments of the present disclosure. FIG. 5 is a graph showing probe power and temperature measurements taken during continuous ramp heating and pulse ramp heating tests, according to various embodiments of the present disclosure.

Referring to FIGS. 1, 4, and 5, in operation 402, the method may include disposing a TTV 200 on a wafer chuck 310 of a wafer prober 300. For example, the TTV 200 may be disposed on a top surface of the wafer chuck 310 and held in position using a suction or vacuum force. Thermal probes 210 of the TTV 200 may be electrically connected to a vehicle controller 100 and/or a prober controller 350, for example using wires. The position of the TTV 200 may be determined using position sensors 312 of the wafer chuck 310. In particular, the TTV 200 may be positioned such that two or more of the probes 210 completely or at least partially overlap with the internal coolant line 314 of the chuck 310 in a vertical direction perpendicular to the top surface of the chuck 310. The vertical overlap of the probes 210 and the coolant line 314 may be important for collecting temperature data from portions of the top surface of the chuck 310 that have the highest heat transfer with the cooling fluid in the coolant line 314.

In operation 404, power may be supplied to heaters 212 of the thermal probes 210 to heat the substrate 202. A cooling fluid may be circulated via coolant line 314 though the wafer chuck 310 during the heating. In some embodiments, the power may be increased according to a continuous ramp heating profile or a pulse ramp heating profile. However, any suitable heating profile may be used.

For example, during continuous ramp heating, during a first time period during which no power is applied to the heaters, temperature data generated by the inner and outer temperature sensors of each thermal probe 210 may be recorded. A first wattage may then be applied to the heater 212 and temperature data may be recorded, for second time period. A higher second wattage may then be applied to the heaters 212 and temperature data may be recorded for a third time period. A higher third wattage may then be applied to the heaters 212 and temperature data may be recorded for a fourth time period. The first time period, second time period, third time period, and fourth time period may be the same or may be different. In some embodiments, the time periods where no voltage is applied may be sufficient for the temperature of the TTV 200 to return to a baseline temperature (e.g., a temperature of the wafer chuck 310 prior to the application of a voltage to the heaters 212). For example, in some embodiments, the first time period, second time period, third time period, and fourth time period may each range from about 10 seconds to about 3 minutes, such as from about 20 seconds to about 2 minutes, from about 30 seconds to about 1 minute and 30 seconds, or from about 45 second to about 1 minute. This process may be continued for any number of time periods until a set maximum wattage is applied. In various embodiments, the process may be repeated for one or more cycles.

During pulse ramp heating, a first wattage may be applied to the heaters 212 and temperature generated by inner and outer temperature sensors of each thermal probe 210 may be recorded, for a first time period. No power may be applied to the heaters and temperature data may be recorded for a second time period. A higher second wattage may be applied to the heaters and temperature data may be recorded for a third time period. No power may be applied to the heaters and temperature data may be recorded for a fourth time period. The first time period, second time period, third time period, and fourth time period may be the same or may be different. In some embodiments, the time periods where no voltage is applied may be sufficient for the temperature of the TTV 200 to return to a baseline temperature (e.g., a temperature of the wafer chuck 310 prior to the application of a voltage to the heaters 212). For example, in some embodiments, the first time period, second time period, third time period, and fourth time period may each range from about 10 seconds to about 3 minutes, such as from about 20 seconds to about 2 minutes, from about 30 seconds to about 1 minute and 30 seconds, or from about 45 second to about 1 minute. This process may be continued for any number of time periods until a set maximum wattage is applied. In various embodiments, the process may them be repeated for one or more cycles.

In some embodiments, operation 404 may be repeated using different coolant flow rates and/or temperatures. In other embodiments, operation 404 may be repeated using different ramp heating profiles. In various embodiments, the wattage applied to the heaters 212 may be increased from time period to time period by an amount ranging from 10 watts to 50 watts, such as from 20 to 30 watts, or about 25 watts. A maximum wattage applied to the heaters 212 may be 200 watts or more.

In operation 406, temperature data generated by the thermal probes 210 may be stored in the vehicle controller 100. In various embodiments, operations 404 and 406 may be performed simultaneously. For example, the temperature data may be recorded during the cycling of the heaters.

In operation 408, the temperature data may be analyzed to determine the thermal characteristics of the wafer chuck 310. For example, the temperature data collected from each thermal probe 210 may be compared to determine the thermal consistency of the wafer chuck 310. Excessive probe-to-probe temperature variations may indicate a chuck defect. The temperature data may also be analyzed to determine a maximum heat dissipation capability of the wafer chuck 310. The temperature data may alternatively or additionally be analyzed to determine a temperature ramping rate of the wafer chuck 310. In some embodiments, the temperature data may be analyzed to determine the physical characteristic consistency of the wafer chuck, such as the flatness of the top surface of the wafer chuck 310 and/or the consistency of the diameter of the coolant channels 314 of the wafer chuck 310.

The temperature data may be processed in the vehicle controller 100 by the processor 102. In the alternative, the temperature data may be provided to the wafer prober 300 and processed by the prober controller 350. As such, the computing power and/or complexity of the processor 102 may be reduced. However, the present disclosure is not limited to any particular processing apparatus or processing location.

In various embodiment the method may optionally include operation 410. In operation 410, the thermal characteristics determined in operation 408 may be compared to the thermal characteristics required for a particular application. For example, in embodiments in which the thermal characteristics of the wafer chuck 310 exceed the minimum thermal characteristic requirements of the application, the wafer chuck 310 may be recommended to the customer for the specific application.

In some embodiments, the method may further include testing multiple chucks of the same type (e.g., the same model of wafer chuck from the same vender) in order to determine whether the wafer chucks have a wafer chuck to wafer chuck thermal physical characteristics consistency sufficient to satisfy the requirements of a customer. In other embodiments, the method may include testing multiple wafer chucks from multiple different venders to determine the thermal and/or physical characteristics thereof and/or to determine the wafer chuck to wafer chuck characteristic consistency of each model of wafer chuck. The thermal and/or physical characteristics of each model of wafer chuck may then be compared, in order to determine which model of wafer chuck best satisfies the requirements of a customer. As such, a particular model and vender may be recommended to a customer.

According to various embodiments, provided is a chuck testing system 10 that allows for standardized testing of wafer chucks 310 for a variety of applications. The system includes a TTV 200 that may replace the testing apparatus, application-specific semiconductor wafer, and prober card currently used for chuck testing. The system 10 may include a vehicle controller 100 that may be configured to control TTV 200 heating power and process time and may be configured to record temperature data generated by the TTV. In addition, the chuck testing system 10 may beneficially provide testing data that is not specific to a particular product semiconductor wafer or wafer orientation. The chuck testing system 10 may also unify hardware specifications for all customers, and especially for customers in the field of high-performance computing testing. The chuck testing system may provide full coverage for a testing surface of a wafer chuck to ensure complete wafer chuck thermal uniformity.

In an embodiment, the chuck testing system 10 may include thermal probes, wherein each thermal probe 210 includes: a heater 212; and temperature sensors 214, 216. In one embodiment, in each thermal probe 210: the heater 212 is annular; and the temperature sensors 214, 216 may include: an inner temperature sensor 214 disposed inside of the heater 212; and an outer temperature sensor 216 disposed outside of the heater 212. In one embodiment, in each thermal probe 210 the inner temperature sensor 214 and the outer temperature sensor 216 may be disposed within 5 mm of the heater 212. In one embodiment, the temperature sensors 214, 216 may include a thermocouple, a silicon-based sensor, a thermistor, or combinations thereof. In one embodiment, the chuck testing system 10 may include a substrate 202 wherein the substrate 202 may include a semiconductor material, a metal, or a ceramic material. In one embodiment, the vehicle controller 100 may include: power contacts 110 electrically connected to heaters 212 of the thermal probes 210; sensor contacts 112 electrically connected to temperature sensors 214, 216 of the thermal probes 210; a processor 102 configured to control power output from the power contacts to the heaters and to store temperature data provided to the sensor contacts 112 from the temperature sensors 214, 216; a switch 106 electrically connected to the processor 102; and a display 104 electrically connected to the processor 102. In one embodiment, the chuck testing system 10 may further include a wafer prober 300 that includes: a wafer chuck support 320; a wafer chuck 310 disposed on the wafer chuck support 320 and having a top surface that is configured to vertically support a wafer 202; a cooler 330 configured to provide a cooling fluid to the wafer chuck 310; and a prober controller 350 configured to control the wafer prober 300 and process the temperature data stored in the vehicle controller 100. In one embodiment, the TTV 200 may be disposed on the wafer chuck 310, such that the substrate 202 covers at least 95% of the upper surface of the wafer chuck 310. In one embodiment, the wafer chuck 310 includes an internal cooling line; and the temperature sensors 214, 216 at least partially vertically overlap with the cooling line. In one embodiment, the wafer chuck 310 includes a position sensor 312; and one of the temperature sensors 214, 216 vertically overlaps with the position sensor 312.

According to another aspect of the present disclosure, a system 10 for testing a wafer chuck 310, may include: a wafer prober 300 that includes: a wafer chuck 310 that includes an internal coolant line; and a cooler 330 configured to circulate a cooling fluid through the internal coolant line 314; a thermal test vehicle (TTV) 200 including: a substrate 202 disposed on a top surface of wafer chuck 310; and thermal probes 210 configured to heat the substrate 202 and generate temperature data, the thermal probes 210 disposed on the substrate 202 such that at least two of the thermal probes 210 at least partially overlap with the internal coolant line 314 in a vertical direction perpendicular to the top surface of the wafer chuck 310; and a vehicle controller 100 configured to provide power to the thermal probes 210 and store the temperature data.

In one embodiment, the thermal probes 210 may include: heaters 212 configured to heat the substrate 202; and temperature sensors 214, 216 configured to generate the temperature data. In one embodiment, each thermal probe 210 may include: an annular temperature sensor; an inner temperature sensor 214 disposed inside of the annular temperature sensor; and an outer temperature sensor 216 disposed outside of the annular temperature sensor. In one embodiment, the vehicle controller 100 may include: power contacts 110 electrically connected to the heaters 212; sensor contacts 112 electrically connected the temperature sensors 214, 216; and a processor 102 configured to control a wattage provided to the heaters 212 and to store temperature data provided to the sensor contacts 112 from the temperature sensors 214, 216; a switch 106 electrically connected to the processor 102; and a display 104 electrically connected to the processor 102. In one embodiment, the processor 102 may be configured to cycle the wattage supplied to the heaters 212 according to a continuous ramp profile or a pulse ramp profile. In one embodiment, the wafer prober 300 may include a probe controller 350 configured to process the temperature data to determine thermal properties of the wafer chuck 310.

In various embodiments, provided is a method of testing a wafer chuck 310 configured to support a semiconductor wafer, the method comprising: disposing a thermal test vehicle (TTV) 200 on the wafer chuck 310, the TTV 200 comprising: a substrate 202 disposed on the top surface of wafer chuck 310; and thermal probes 210 disposed on the substrate 202; supplying power to the thermal probes 210 to heat the substrate 202; recording temperature data generated by the thermal probes 210; and processing the temperature data to determine the thermal properties of the wafer chuck 310.

The various embodiments disclosed herein provide a number of unique and useful features to improve the ability to thermal test wafer check. These features include a programmable logic controller (PLC) for a TTV 200 wafer control. The various embodiment systems may provide for automatic temperature data collection and quality control result analysis. The various embodiments provide full coverage for wafer chuck uniformity check. The various features allow the various embodiments to be able to heat a wafer and sense the wafer temperature without a tester, test program, and probe card. The various embodiments may provide a ready standard jig to detect low performance during new installations or pre-maintain. The various embodiments may allow for unified hardware specification to test a variety of wafers from a variety of potential customers. The various embodiments may further allow for a unified standard for new cooling system development or evaluation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for detecting a thermal conductivity of a wafer chuck, comprising:
   a thermal test vehicle (TTV) comprising:
      a substrate configured to contact a wafer chuck; and
      thermal probes disposed on the substrate; and
   a vehicle controller configured to control heating of the substrate and the wafer chuck by the thermal probes and to store wafer chuck temperature data generated by the thermal probes.

2. The system of claim 1, wherein each thermal probe is electrically connected to the vehicle controller and comprises:
   a heater; and
   temperature sensors.

3. The system of claim 2, wherein in each thermal probe:
   the heater is annular; and
   the temperature sensors comprise:
      an inner temperature sensor disposed inside of the heater; and
      an outer temperature sensor disposed outside of the heater.

4. The system of claim 3, wherein in each thermal probe the inner temperature sensor and the outer temperature sensor are disposed within 5 mm of the heater.

5. The system of claim 2, wherein the temperature sensors comprise a thermocouple, a silicon-based sensor, a thermistor, or combinations thereof.

6. The system of claim 1, wherein the substrate comprises a semiconductor material, a metal, or a ceramic material.

7. The system of claim 1, wherein the vehicle controller comprises:
   power contacts electrically connected to heaters of the thermal probes;
   sensor contacts electrically connected to temperature sensors of the thermal probes;
   a processor configured to control power output from the power contacts to the heaters and to store temperature data provided to the sensor contacts from the temperature sensors;
   a switch electrically connected to the processor; and
   a display electrically connected to the processor.

8. The system of claim 1, further comprising a wafer prober comprising:
   a wafer chuck support;
   a wafer chuck disposed on the wafer chuck support and having a top surface that is configured to vertically support a wafer;
   a cooler configured to provide a cooling fluid to the wafer chuck; and
   a prober controller configured to control the wafer prober and process the temperature data stored in the vehicle controller.

9. The system of claim 8, wherein the TTV is disposed on the wafer chuck, such that the substrate covers at least 95% of the upper surface of the wafer chuck.

10. The system of claim 8, wherein:
   the wafer chuck comprises an internal cooling line; and
   the temperature sensors at least partially vertically overlap with the cooling line.

11. The system of claim 8, wherein:
   the wafer chuck comprises a position sensor; and
   one of the temperature sensors vertically overlaps with the position sensor.

12. A system for detecting a thermal conductivity of a wafer chuck, comprising:
   a wafer prober comprising:
      a wafer chuck comprising an internal coolant line; and
      a cooler configured to circulate a cooling fluid through the internal coolant line;
   a thermal test vehicle (TTV) comprising:
      a substrate disposed on a top surface of wafer chuck; and
      thermal probes configured to heat the substrate and the wafer chuck and generate wafer chuck temperature data, the thermal probes disposed on the substrate such that at least two of the thermal probes at least partially overlap with the internal coolant line in a vertical direction perpendicular to the top surface of the wafer chuck; and
   a vehicle controller configured to provide power to the thermal probes and store the wafer chuck temperature data.

13. The system of claim 12, wherein the thermal probes are electrically connected to the vehicle controller and comprise:
   heaters configured to heat the substrate; and
   temperature sensors configured to generate the wafer chuck temperature data.

14. The system of claim 13, wherein each thermal probe comprises:
   an annular temperature sensor;
   an inner temperature sensor disposed inside of the annular temperature sensor; and
   an outer temperature sensor disposed outside of the annular temperature sensor.

15. The system of claim 13, wherein the vehicle controller comprises:
   power contacts electrically connected to the heaters;
   sensor contacts electrically connected the temperature sensors; and
   a processor configured to control a wattage provided to the heaters and to store temperature data provided to the sensor contacts from the temperature sensors;
   a switch electrically connected to the processor; and
   a display electrically connected to the processor.

16. The system of claim 15, wherein the processor is configured to cycle the wattage supplied to the heaters according to a continuous ramp profile or a pulse ramp profile.

17. The system of claim 15, wherein the wafer prober comprises a probe controller configured to process the temperature data to determine thermal properties of the wafer chuck.

18. A method of detecting a thermal conductivity of a wafer chuck configured to support a semiconductor wafer, the method comprising:
   disposing a thermal test vehicle (TTV) on the wafer chuck, the TTV comprising:

a substrate disposed on the top surface of wafer chuck; and thermal probes disposed on the substrate;

supplying power to the thermal probes to heat the substrate and the wafer chuck;

recording wafer chuck temperature data generated by the thermal probes; and processing the wafer chuck temperature data to determine thermal properties of the wafer chuck.

19. The method of claim 18, wherein the supplying power to the thermal probes comprises cycling a wattage provided to heaters of the thermal probes according to continuous ramp heating profile or a pulse ramp heating profile.

20. The method of claim 18, wherein processing the wafer chuck temperature data to determine thermal properties of the wafer chuck comprises measuring thermal probe-to-thermal probe temperature variations.

* * * * *